United States Patent [19]

Stoll et al.

[11] Patent Number: 5,443,672
[45] Date of Patent: Aug. 22, 1995

[54] PROCESS FOR COATING CIRCUIT BOARDS

[75] Inventors: Reiner Stoll, Seligenstadt; Britta Schulmeyer, Frankfurt, both of Germany

[73] Assignee: E. I. Du Pont de Nemours and Company, Wilmington, Del.

[21] Appl. No.: 317,495

[22] Filed: Oct. 4, 1994

[51] Int. Cl.⁶ .............................................. B29C 47/00
[52] U.S. Cl. ...................... 156/244.17; 156/244.25; 156/247; 156/273.7; 156/273.9; 156/275.5; 427/96; 427/359; 427/369; 427/385.5; 427/487; 427/553; 427/581; 427/595
[58] Field of Search ............ 427/96, 359, 369, 385.5, 427/487, 553, 581, 595; 156/244.17, 244.25, 247, 273.7, 273.9, 275.5

[56] References Cited

U.S. PATENT DOCUMENTS

| | | | |
|---|---|---|---|
| 3,469,982 | 9/1969 | Celeste | 96/35.1 |
| 3,547,730 | 12/1970 | Cohen et al. | 156/345 |
| 4,230,793 | 10/1980 | Losert et al. | 430/315 |
| 4,983,252 | 1/1991 | Masui et al. | 156/630 |

FOREIGN PATENT DOCUMENTS

| | | |
|---|---|---|
| 0080665 | 6/1983 | European Pat. Off. . |
| 0099426 | 2/1984 | European Pat. Off. . |
| 0259853 | 3/1988 | European Pat. Off. . |
| 0374876 | 6/1990 | European Pat. Off. . |
| 0080665B2 | 2/1992 | European Pat. Off. . |
| WO92/07679 | 5/1992 | WIPO . |
| WO93/13638 | 7/1993 | WIPO . |

Primary Examiner—Bernard Pianalto

[57] ABSTRACT

A process is disclosed for coating a circuit board with a photopolymerizable material which is applied by extension at temperatures of 100° to 180° C. followed by distributing the material under pressure by a roller.

11 Claims, No Drawings

PROCESS FOR COATING CIRCUIT BOARDS

BACKGROUND OF THE INVENTION

This invention involves a process for coating circuit boards, especially those with through-plated holes, with photopolymerizable, solvent-free, thermoplastic material.

Research Disclosure 249019, January 1985, and European Patent 00 80 665 describe processes for mixing a photopolymerizable compound by melt extrusion and coating the melt on a support. Such processes have been used industrially to manufacture photopolymerizable products, such as flexographic printing plates, by coating the photopolymerizable composition on the essentially flat surface of the support.

However, in the manufacture of circuit boards, individual boards with a surface already populated by holes or conductor lines are coated by the user.

Such coatings of resist materials serve, on one hand, in forming the conductor lines and on the other hand, in protecting them during solder processes. The coatings are required during various process steps to protect the underlying material from attack by processing baths, such as developers, etchants, and electroplating agents.

Whereas resist material is applied imagewise by screen printing methods when requirements in conductor line precision are low, photographic methods are used when fine patterns require high resolution. In the latter method, the resist layer is first coated uniformly on the entire surface. Then the layer is exposed imagewise through a transparency and developed by washing out the exposed areas (for positive-working resist materials) or the unexposed areas (for negative-working resist materials) of the resist image.

Various coating processes are known and adapted to the properties of the photoresist materials required for different uses, as follows.

Liquid photoresists, mostly based on diazo compounds, are applied by spin coating or by dip coating the support. They can also be applied continuously by various coating processes, particularly curtain coating (as, for example, in U.S. Pat. No. 4,230,793) or by spray processes, especially electrostatic spray processes.

Electrophoretic deposition produces the resist layer with another group of liquid photoresists.

These processes are suitable for liquid photoresists having low viscosity due to the addition of solvents. Therefore, the boards must be dried after the coating step.

Another coating process is roller coating, whereby the liquid coating material is applied by rollers onto the surface to be coated. The rollers usually have surfaces structured to accept adequate coating material (PCT/WO 92/07679).

Such liquid photoresists are relatively expensive and are particularly suitable for making thin layers. However, they have the disadvantage that both sides of the circuit board cannot be coated simultaneously, a uniform coating requires great technical effort, and the unhardened resist surface is very sensitive to dust and mechanical damage. It has also been found difficult to coat populated circuit boards with solder mask, because vertical surfaces are not satisfactorily coated by the liquid resist. In particular, protecting through-plated holes is difficult. Although the liquid resist penetrates into the holes easily due to its low viscosity, it does not fill the holes completely and reliably, because it is difficult to expel air from the holes. Therefore, through-platings are not sufficiently protected and can be destroyed or attacked during etching.

Electrophoretically deposited, liquid photoresists yield an especially uniform coating. However, they require conductive substrates and therefore, cannot be used, for example, as solder masks. Coating thickness is limited to a maximum of about 15 m, which is too thin for an electroplating resist; therefore, they can be considered only as etching resists.

As with low viscosity, liquid photoresists, this method also has specific drawbacks in coating circuit boards with through-plated holes. The thin layer does not fill the holes completely; many holes have only their walls covered. To protect the holes with negative working photoresists, the resist layers on the walls must be hardened reliably by exposure. This is not definitely assured in holes with a high aspect ratio (depth/diameter).

With positive working resists, on the other hand, it is necessary to reliably prevent the holes from being exposed during the entire processing sequence. This is possible only by ensuring no exposure of defined surface area exposure and protecting such surface areas in all succeeding process steps from actinic light.

Many of the above disadvantages are eliminated by dry resist films, which consequently have become widely used. These are described, for example, in U.S. Pat. Nos. 3,469,982 and 3,547,730. They have a sandwich structure with a photopolymerizable layer between a temporary support and a transparent cover sheet. In most cases, the photopolymerizable layer is transferred onto the circuit board, is exposed imagewise through a circuit pattern transparency, and after the removal of the cover sheet, is washed out with a suitable solvent.

Dry resists are outstanding for their simple handling, for a layer thickness very accurately adjusted by the producer, and for the resist surface being well protected by a cover sheet. However, their ability to conform to structured supports is limited. A special disadvantage is that holes can be protected only by tenting. This process involves covering the holes with photoresist film. Care must be taken during exposure to assure that the resist is exposed not only over the hole but also on an larger anchoring area around the hole. This requires additional space on the circuit board and can lead to space problems with the increasingly higher packing density of the circuits. In addition, this does not always assure that large holes are protected reliably by tenting.

Therefore, the problem involved in this invention is to develop a process for coating circuit boards, especially circuit boards having holes, with photopolymerizable material, whereby holes can be protected reliably without lateral overlays, drying is not needed, the process is not complicated to perform, and it produces coatings, about 5 to 100 m thick, that conform well to possibly populated supports.

SUMMARY OF THE INVENTION

The present invention is directed to a process for a coating circuit board with a photopolymerizable material contaiing a thermoplastic, polymeric binder, an addition-polymerizable, ethylenically unsaturated compound, and an initiator activable by radiation, comprising the steps of (a) applying by extrusion the photopolymerizable material at a temperature of 100° to 180° C.

onto a surface of the circuit board and (b) distributing the photopolymerizable material under pressure over the surface of the board by at least one roller.

DETAILED DESCRIPTION OF THE INVENTION

Suitable photopolymerizable materials are known and used in photohardenable or photodegradable, negative-working or positive-working systems. Preferred photopolymerizable compositions contain essentially a thermoplastic polymeric binder, an addition-polymerizable, ethylenically unsaturated compound, and a polymerization initiator that can be activated by radiation, but do not contain a solvent. Their viscosity is sufficiently high at room temperature that they do not flow. At a processing temperature of 100° to 140° C., the viscosity is 10 to 1000 PaS, preferably between 40 and 400 PaS.

The thermoplastic, polymeric binders are typically copolymers of olefinically unsaturated carboxylic acids with other monomers. Preferred binders are copolymers of acrylic acid, methacrylic acid, maleic acid, and itaconic acid with styrene and/or alkyl acrylates and/or alkyl methacrylates. The reaction products of copolymers of olefinically unsaturated carboxylic acids and/or dicarboxylic acid anhydrides with the above-cited co-monomers and water, alcohols, and/or amines can also be used; anhydrides of maleic acid, itaconic acid, and citraconic acid are preferred.

Suitable addition-polymerizable, ethylenically unsaturated compounds that can be used alone or with other monomers include acrylic and methacrylic acid derivatives, such as acrylamides, methacrylamides, alkyl acrylates, alkyl methacrylates, and especially esters of acrylic acid and methacrylic acid with diols and polyols, such as ethylene glycol, diethylene glycol, trimethylol propane, pentaerythritol, and polyethylene glycols.

The total quantity of monomers in the photopolymerizable compositions typically is 10 to 80 percent by weight relative to the total mixture.

The photoinitiators or photoinitiator systems illustratively can be any compound known for this purpose. Examples are 9-phenyl- acridine, 9,10-dimethylbenzophenazine, benzophenone/Michler's ketone, and hexaarylbisimidazole/mercaptobenzoxazole. The photoinitiators can be used in quantities of 0.01 to 10 percent by weight of the photopolymerizable material.

The photopolymerizable materials can also contain other additives, such as, for example, dyes, pigments, plasticizers, adhesion promoters, fillers, and especially, stabilizers; the latter assure that the material withstands being heated briefly to the coating temperature without undergoing chemical changes, especially thermal polymerization.

The photopolymerizable material is coated on the circuit board preferably by hot extrusion. It is also advisable to preheat the support. The preheating temperature typically is between 80° and 180° C., preferably between 100° and 140° C. The photopolymerizable material is applied, for example, on the leading edge of the support in an amount adequate to coat the entire surface in the desired layer thickness. In another version, the photopolymerizable material is coated continuously as a film covering the entire width of the board.

The high viscosity of the photopolymerizable materials permits also coating the bottom side of the support, so that both sides can be coated simultaneously.

Different photopolymerizable materials can be used to coat the top and bottom sides of the circuit board. For example, a high viscosity material can be coated, preferably first, on the top side and a film-forming material on the bottom side.

The photopolymerizable material is distributed on the support under pressure by the rollers of a calender or laminator through which is passed the circuit board to be coated. The rollers are heated to a temperature preferably 10° to 50° C. higher than that of the circuit board. At this temperature, the viscosity of the photopolymerizable material decreases, so that, under roller pressure, the material forces air out of all of the irregularities and holes in the circuit board, completely covering its surface and filling the holes. Coating thickness can be controlled by varying temperature, roller pressure, and roller feed rate. The attainable coating thickness precision is ±10% of the total thickness.

The recommended pressure of the calender or laminator rollers on the circuit board is 0.2 to 5, preferably 0.5 to 2 kg/cm$^2$.

In a preferred embodiment, a transparent sheet is laminated on both sides of the support having the photopolymerizable material. The sheets prevent the photopolymerizable layers from adhering to the calender rollers or to the transparency in the later exposure step, and they simultaneously protect the photopolymerizable layers from contact with oxygen in the air, which decreases the sensitivity of the photopolymerizable materials. The preferred protective sheets are polyester sheets, for example, polyethylene terephthalate.

Suitable support materials are metals, such as aluminum, steel, zinc, and copper, synthetic resin sheets, such as polyethylene terephthalate, cellulose acetate, and glass. Copper-clad synthetic resin boards are mostly used for making circuit boards.

Exposure to actinic light causes photopolymerization that results in a solubility difference between exposed and unexposed areas. The exposure is made through a transparency of the circuit pattern. This transparency need not contain the pattern corresponding accurately to the holes, as required in other processes. It suffices rather to expose the pattern of the conductor lines.

The unhardened areas are washed out by suitable solvents. The washout time is selected so that the unexposed areas on the surface of the circuit board are dissolved, but the unexposed or partially exposed material in the holes is not or is not completely dissolved. The material remaining on the surface is the resist layer and protects the underlying metal in the succeeding etching or electroplating step. The photopolymerizable material remaining in the holes protects the through-plating in the hole.

All of the remaining resist is finally removed in a strongly alkaline stripping bath.

It was surprising and contrary to state-of-the-art processes that the holes did not have to be exposed to be reliably protected. This eliminates the otherwise required accurate registration between the photomask and the hole locations. In addition, the unpolymerized photopolymerizable material is more easily removed in the stripping step than the polymerized material. This reduces the risk of residue formation and thus makes the subsequent steps more reliable.

The thickness of the layers produced by the process of the invention can be adapted within wide limits to the requirements of subsequent processing steps. This thickness can be from 2 to 100 m and more. Layers of 15 to 30 m are preferred for etching, between 30 and 50 m for electroplating layer buildup.

The present process can also be used to apply solder mask. A circuit board with conductor lines is coated as described above, so that the channels between the conductor lines and the holes are well filled as a result of the outstanding conformability of the coating material. The circuit board is populated after exposure and development.

Because the good conformability produces good contact between the photopolymerizable material and the circuit board, the solder process can be conducted without the otherwise possible risk of separation of the solder mask.

To further illustrate the present invention, the following examples are provided. All parts and percentages are by weight unless otherwise indicated.

EXAMPLE 1

A photopolymerizable material is prepared from:

65 g of a copolymer of methyl methacrylate/ethyl acrylate/methacrylic acid (51/29/20)
25 g of trimethylolpropane trimethacrylate
0.3 g of Victoria blue
4 g of ethyl-4-(dimethylamino)benzoate
6.5 g of benzophenone
2 g of Michler's ketone.

The components are mixed thoroughly in an extruder. A circuit board, 100×200 mm and 3 mm thick with 0.5 to 6 mm diameter holes, is heated to 100° C. 2 g of the above formulation are melted at 120° C. and applied with a hot glue gun as two strips on the leading edge of the top and bottom sides of the circuit board. A laminator (Du Pont RISTON HRL) is loaded with MYLAR 92 polyester. A polyethylene terephthalate film and its rollers are heated to 140° C. The circuit board is passed through the laminator at a feed rate of 0.5 m/min. This rolls out the photopolymerizable material to a layer about 25 m thick. All holes are completely filled with the photopolymerizable material.

The board is exposed through a line pattern, the holes remaining unaffected. The holes also remain filled even after development with a 1% sodium carbonate solution that uncovers the line pattern. The circuit board is then etched in a conventional acid etching solution and the resist layer is removed in a 1% potassium hydroxide solution. The holes are now also uncovered and a circuit board is obtained with circuit lines and through-plated contacts.

EXAMPLE 2

A photopolymerizable material is prepared as in Example 1 and thoroughly mixed in an extruder. A copper-clad, epoxy resin board, 100×200 mm and 3 mm thick with 0.5 to 6 mm diameter holes, is heated to 100° C. 2 g of the above mixture are melted at 100° C. and applied with a hot glue gun as two strips on the leading edge of the top and bottom sides of the circuit board.

The board is passed through a laminator as in Example 1 at a feed rate of 1.5 m/rain and the photopolymerizable material is rolled out between the polyester sheet and support to a layer about 75 m thick.

The board is exposed through a line pattern, and after removal of the polyester sheet, is developed with a 1% sodium carbonate solution. Copper is deposited on the uncovered areas in a conventional electroplating bath and the resist is removed with a 1% potassium hydroxide solution. The copper base is removed by etching, and a circuit pattern is obtained.

EXAMPLE 3

A photopolymerizable material is extruded as in Example 1 to a 125 m thick film and calendered at 120° C. at a feed rate of 1 m/min to a 40 m thick layer on both sides of a copper-clad, epoxy resin board, 100×200 mm and 3 mm thick with 0.5 to 6 mm diameter holes.

EXAMPLE 4

A board, 100×200 mm and 3 mm thick with 0.5 to 6 mm diameter holes, is heated to 100° C. 2 g of the material of Example 1 are heated to 120° C., applied as a strip on the leading edge of the top side of the circuit board and calendered at 120° C. at a feed rate of 0.5 m/min. A conventional, 25 m thick dry resist film is laminated simultaneously on the bottom side of the board. The board is processed as in Example 1 and after etching, yields a circuit board with through-plated holes.

EXAMPLE 5

A circuit board, 100×200 mm and 3 mm thick with conductor lines, is heated to 100° C. 2 g of the photosensitive layer of a commercial dry solder mask film (Du Pont VACREL 8100) are melted at 120° C., applied as strips on the leading edge of the top and bottom sides of the circuit board, and calendered at 120° C. at 0.5 m/min. The board is exposed through an appropriate photomask in all areas except those to remain uncovered for solder and is developed by washout as described above.

A circuit board is produced on which the spaces between the conductor lines are filled with the solder mask material, and the conductor lines are covered with a 25 m thick layer.

What is claimed is:

1. A process for a coating circuit board with a photopolymerizable material containing a thermoplastic, polymeric binder, an addition-polymerizable, ethylenically unsaturated compound, and an initiator activatable by radiation, comprising the steps of (a) applying by extrusion the photopolymerizable material at a temperature of 100° to 180° C. onto a surface of the circuit board and (b) distributing the photopolymerizable material under pressure over the surface of the board by at least one roller.

2. The process for coating a circuit board according to claim 1, characterized in that the circuit board has at least one of through-plated holes or a circuit pattern.

3. The process for coating a circuit board according to claim 2, wherein the circuit board has through plated holes and the pressure of the rollers and the viscosity are adjusted so that the photopolymerizable material is pressed through the holes.

4. The process for coating a circuit board according to claim 1, characterized in that the photopolymerizable material does not contain a solvent and has a viscosity of 10 to 1000 PaS at a temperature of 100° to 140° C.

5. The process for coating a circuit board according to claims 1, characterized in that the photopolymerizable material has a viscosity of 20 to 400 PaS at 100° to 140° C.

6. The process for coating a circuit board according to claims 1, characterized in that the photopolymerizable material and the circuit board are heated at 80° to 180° C., and the roller has a temperature 10° to 50° C. above the temperature of the circuit board.

7. The process for coating a circuit board according to claim 1, characterized in that the pressure of the roller on the circuit board is 0.2 to 5 kg/cm$^2$.

8. The process for coating a circuit board according to claim 1, characterized in that the pressure of the roller on the circuit board is 0.5 to 2 kg/cm$^2$.

9. The process for coating a circuit board according to claim 1, characterized in that the circuit board is coated simultaneously on both sides.

10. The process for coating a circuit board according to claim 1, characterized in that the photopolymerizable material is covered by a transparent, protective sheet after being coated on the circuit board.

11. The process for coating a circuit board according to claim 10, characterized in that the transparent, protective sheet is laminated on the surface of the photopolymerizable material.

* * * * *